United States Patent
Guerinoni et al.

(10) Patent No.: US 11,340,069 B2
(45) Date of Patent: May 24, 2022

(54) MEMS GYROSCOPE WITH CALIBRATION OF THE SCALE FACTOR IN REAL TIME AND CALIBRATION METHOD THEREOF

(71) Applicant: STMICROELECTRONICS S.R.L., Agrate Brianza (IT)

(72) Inventors: Luca Guerinoni, Alzano Lombardo (IT); Luca Giuseppe Falorni, Limbiate (IT); Matteo Fabio Brunetto, Legnano (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/898,339

(22) Filed: Jun. 10, 2020

(65) Prior Publication Data

US 2020/0400434 A1 Dec. 24, 2020

(30) Foreign Application Priority Data

Jun. 20, 2019 (IT) .......................... 102019000009582

(51) Int. Cl.
*G01C 19/5712* (2012.01)
*G01C 19/5755* (2012.01)
(Continued)

(52) U.S. Cl.
CPC ........ *G01C 19/5712* (2013.01); *B81B 3/0018* (2013.01); *G01C 19/574* (2013.01); *G01C 19/5755* (2013.01); *B81B 2201/0242* (2013.01)

(58) Field of Classification Search
CPC ............ G01C 19/5712; G01C 19/5755; G01C 19/5726; G01C 19/574; G01C 19/5776
See application file for complete search history.

(56) References Cited

U.S. PATENT DOCUMENTS 9,784,581 B2 10/2017 Donadel et al.
2003/0200804 A1* 10/2003 Johnson ................. G01C 19/56
73/504.12

(Continued)

FOREIGN PATENT DOCUMENTS

WO 2010/024729 A2 3/2010

*Primary Examiner* — Helen C Kwok
(74) *Attorney, Agent, or Firm* — Seed IP Law Group LLP (57) ABSTRACT

The MEMS gyroscope has a mobile mass carried by a supporting structure to move in a driving direction and in a first sensing direction, perpendicular to each other. A driving structure governs movement of the mobile mass in the driving direction at a driving frequency. A movement sensing structure is coupled to the mobile mass and detects the movement of the mobile mass in the sensing direction. A quadrature-injection structure is coupled to the mobile mass and causes a first and a second movement of the mobile mass in the sensing direction in a first calibration half-period and, respectively, a second calibration half-period. The movement-sensing structure supplies a sensing signal having an amplitude switching between a first and a second value that depend upon the movement of the mobile mass as a result of an external angular velocity and of the first and second quadrature movements. The first and second values of the sensing signal are subtracted from each other and compared with a stored difference value to supply information of variation of the scale factor.

20 Claims, 5 Drawing Sheets

(51) Int. Cl.
*G01C 19/574* (2012.01)
*B81B 3/00* (2006.01)

(56) References Cited

U.S. PATENT DOCUMENTS

| | | | | |
|---|---|---|---|---|
| 2005/0284222 A1* | 12/2005 | Johnson | ............. | G01C 19/5719 |
| | | | | 73/504.02 |
| 2010/0294039 A1 | 11/2010 | Geen | | |
| 2013/0233048 A1 | 9/2013 | Anae et al. | | |
| 2014/0116108 A1 | 5/2014 | Franke et al. | | |
| 2015/0253138 A1* | 9/2015 | Sutton | ................ | G01C 19/5726 |
| | | | | 73/504.16 |
| 2015/0377623 A1* | 12/2015 | Waters | ............... | G01C 19/5747 |
| | | | | 73/504.12 |
| 2018/0266823 A1* | 9/2018 | Jandak | ............... | G01C 19/5755 |
| 2020/0378763 A1* | 12/2020 | Boser | ................ | G01C 19/5726 |

* cited by examiner

MEMS GYROSCOPE WITH CALIBRATION OF THE SCALE FACTOR IN REAL TIME AND CALIBRATION METHOD THEREOF

BACKGROUND

Technical Field

The present disclosure relates to a MEMS gyroscope with calibration of the scale factor in real time and to the calibration method thereof.

Description of the Related Art

As is known, micro-electro-mechanical systems (MEMS) are used in an increasingly widespread way in various applications, due to their small dimensions, costs compatible with consumer applications, and increasing reliability. In particular, inertial sensors, such as microintegrated gyroscopes and electromechanical oscillators, are manufactured with this technology.

MEMS sensors of this type generally comprise a supporting body and at least one mobile mass, suspended over and coupled to the supporting body via springs or "flexures". The flexures are configured to allow the mobile mass to oscillate with respect to the supporting body according to one or more degrees of freedom. The mobile mass is coupled to the supporting body generally capacitively and forms therewith capacitors with variable capacitance. In particular, the movement of the mobile mass with respect to the fixed electrodes on the supporting body, due to the action of forces acting thereon, modifies the capacitance of the capacitors. The displacement of the mobile mass with respect to the supporting body is detected from the capacitive variation, and the external force causing displacement is calculated from the detected displacement.

Among MEMS sensors, gyroscopes have a complex electro-mechanical structure that typically comprises at least two masses mobile with respect to the supporting body, coupled to each other to have a number of degrees of freedom depending upon the architecture of the system. In the majority of cases, each mobile mass has one or at the most two degrees of freedom, but MEMS gyroscopes having a single mobile mass with three degrees of freedom are spreading. In all cases, the capacitive coupling is obtained through fixed and mobile driving or actuation electrodes and through fixed and mobile sensing electrodes.

In the implementation with two mobile masses, a first mobile mass is dedicated to driving and is kept in oscillation in or about a first direction at resonance frequency and at a controlled oscillation amplitude. A second mobile mass is driven through the first mobile mass and, in case of rotation of the gyroscope about an axis thereof perpendicular to the first direction and at an angular velocity, is subject to a Coriolis force proportional to the angular velocity and perpendicular to the driving direction and to the rotation axis.

In the implementation with a single mobile mass, the mass is coupled to the supporting body to be mobile with respect to the latter with two independent degrees of freedom, namely a degree of freedom for driving and a degree of freedom for sensing. The latter may include a movement of the mobile mass in its plane (in-plane movement) or in a direction perpendicular thereto (out-of-plane movement). A driving device keeps the mobile mass in controlled oscillation according to one of the two degrees of freedom. The mobile mass moves according to the other degree of freedom in response to the rotation of the supporting body, due to the Coriolis force.

Figure 1:
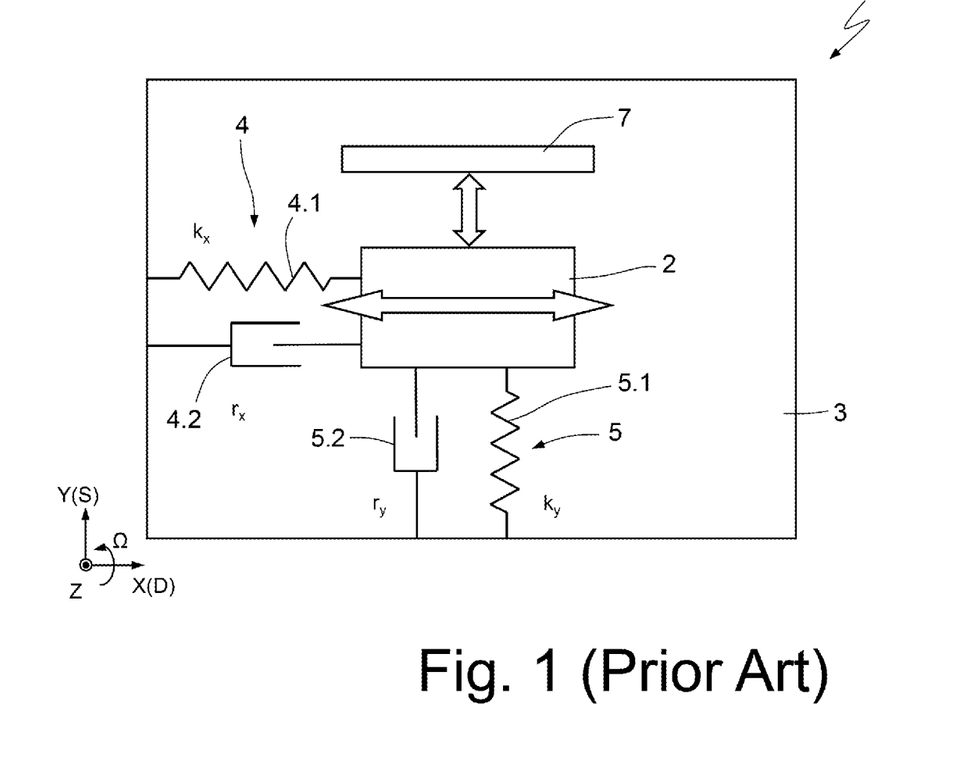
FIG. 1 shows a principle diagram of a known MEMS gyroscope.

A basic diagram of a single mass gyroscope is illustrated in FIG. 1, which broadly represents the mechanical sensing structure of a gyroscope 1. Here, the gyroscope 1 comprises a mobile mass 2 supported by a supporting structure 3 (illustrated schematically) through a first and a second flexure system 4, 5, also illustrated only schematically and each represented by respective elastic elements 4.1, 5.1 (having respective elastic constants $k_x$ and $k_y$) and respective damping elements 4.2 and 5.2 (having respective elastic constants $r_x$ and $r_y$).

In FIG. 1, the first flexure system 4 enables movement of the mobile mass 2 in a first direction, parallel to a first axis of a Cartesian reference system (here axis X) and is therefore referred to as driving direction X, and the second flexure system 5 enables movement of the mobile mass 2 in a second direction, parallel to a second axis of the Cartesian reference system (here axis Y) and is therefore referred to as sensing direction Y.

In FIG. 1, driving electrodes (not illustrated) cause oscillation of the mass 2 in the driving direction X. In presence of a rotational movement $\Omega$ of the gyroscope 1 about an axis parallel to axis Z (which therefore forms a rotation direction Z), the Coriolis force causes an oscillatory movement of the mobile mass 2 in the sensing direction Y, in a known way. This movement brings about a variation of the distance or gap between the mobile mass 2 (or a mobile electrode fixed thereto in the movement direction Y) and a fixed electrode 7 and may be detected from the resulting capacitive variation $\Delta C$.

As mentioned, real MEMS gyroscopes have a complex structure and frequently non-ideal electromechanical interactions between the mobile mass and the supporting body, for example due to manufacturing defects, process spread, environmental conditions, and ageing that modify the scale factor of the gyroscope, i.e., the ratio between the output signal of the gyroscope (variation of capacitance $\Delta C$) and the angular velocity $\Omega$ to be detected.

In fact, the above conditions may give rise to a disturbance acting in the sensing direction Y, increasing or reducing the elongation of the mobile mass 2 caused by the Coriolis force in the sensing direction Y and/or varying the distance between the mobile mass 2 and the fixed electrode 7 and therefore giving rise to different capacitive variations between the mobile mass and the fixed electrode, causing a variation of the scale factor.

The above fact may also be demonstrated mathematically from the definition of the scale factor s of a gyroscope of the type illustrated in FIG. 1.

In detail, we have:

$$s = \frac{\Delta C}{\Omega} = \frac{1}{\Omega}\left[\frac{dC}{dy}*y\right] = \frac{1}{\Omega}\left[\frac{\varepsilon_0 A}{g^2(\overline{d})}*H(\overline{d})*F_C\right] \quad (1)$$

wherein y is the sensing displacement, $\varepsilon_0$ is the vacuum dielectric constant, A is the facing area between the fixed electrode 7 and the mobile mass 2, $\overline{d}$ is the amplitude of the external disturbance, $g(\overline{d})$ is the gap as a function of the external disturbance, $H(\overline{d})$ is the transfer function of the gyroscope, i.e., the unit displacement due to the external disturbance, and $F_C$ is the Coriolis force due to the angular velocity $\Omega$.

From Eq. (1), it is evident that the scale factor depends upon external disturbance to a non-negligible extent.

On the other hand, the stability of the scale factor throughout the service life is an important parameter for gyroscopes since it has a direct effect on the detection reliability.

Solutions are known attempting to compensate for known disturbance by trimming techniques. For instance, when the scale factor varies because of variations of external temperature, which causes, for example, modification of the stiffness of the elastic suspension structures, it is possible to measure the external temperature and to correct the measurement to eliminate the error using a behavioural model that is known and/or measured during final testing. However, when the disturbance cannot be measured (for example, because it is due to the process of soldering on the mounting board), above all when it is variable in time (as for modification of the elastic parameters caused by ageing of the materials or other degenerative phenomena), the problem is more difficult to solve.

Consequently, it is desirable for the gyroscope to be able to reject external disturbance, in particular disturbance that is variable in time, for example caused by variations in temperature, stress, humidity, etc., which in turn cause variations of electrical and/or mechanical parameters in the gyroscope.

To this end, other known solutions comprise interrupting operation of the gyroscope in order to measure scale factor variations that have intervened during the service life. However, this solution is disadvantageous in since, in these periods of time, the gyroscope is not operative, a fact that may be unacceptable in certain applications.

BRIEF SUMMARY

One aim of the present disclosure is therefore to provide a gyroscope that overcomes one or more of the drawbacks of the prior art.

According to the present disclosure a MEMS gyroscope, an electronic processing unit, a gyroscope system and a calibration method thereof are provided.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

The present gyroscope comprises an "in-run" measurement circuit, i.e., one operating during normal operation of the gyroscope, based upon application, at preset instants, of a quadrature stress, therefore perpendicular to the driving stress and acting parallel to the sensing direction, of a known value, and upon measurement and comparison of the signal thus obtained with a signal measured in absence of the quadrature stress.

Figure 2A:
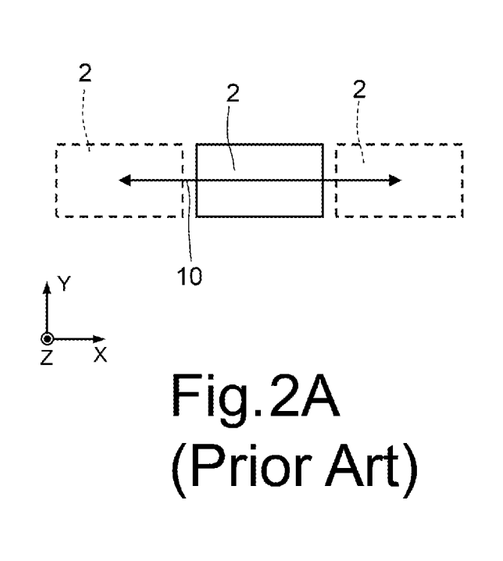
FIGS. 2A and 2B show the movement of the gyroscope of FIG. 1 in case of absence, and, respectively, of presence, of a quadrature force and in absence of angular velocity.
Figure 2B:
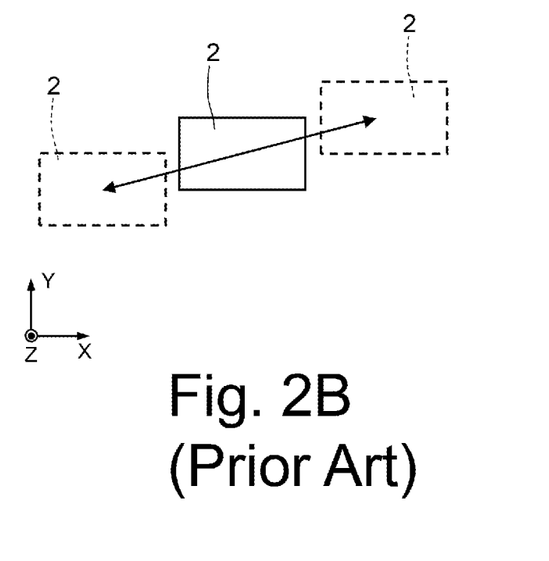

Quadrature signals are frequently present in gyroscopes as undesired effect of imperfections of manufacture, and give rise to forces (referred to as quadrature forces) acting perpendicularly to the driving direction, as illustrated in FIGS. 2A and 2B with reference to the gyroscope 1 of FIG. 1. In particular, FIG. 2A shows the driving movement (exaggerated for reasons of clarity) of the mobile mass 2 in the driving direction X. In absence of angular velocity and of quadrature forces, the mobile mass 2 moves with oscillatory and translational motion in just the driving direction X, as represented by the dashed positions of the mobile mass 2 and by the arrow 10. A possible quadrature force, acting perpendicularly to the driving direction X, brings about (even in absence of the angular velocity) a movement of the mobile mass 2 also in the sensing direction Y, as represented by the dashed line in FIG. 2B. In presence of angular velocity about the second Cartesian axis Y, the quadrature movement due to the quadrature force or forces therefore adds to the movement due to the Coriolis force. As used herein, "quadrature movement" refers to movement of the mobile mass is a direction perpendicular to the driving direction.

In this situation, the capacitive variation between the mobile mass 2 and the fixed sensing electrodes 7 is determined by two contributions: one ($\Delta C$, see Eq. (1)) due to the Coriolis force and one ($\Delta C_\Gamma \Delta C_\Gamma$) due to the quadrature forces, which may be expressed as:

$$\Delta C_\Gamma = \left[\frac{dC}{dy} * y_\Gamma\right] = \left[\frac{\varepsilon_0 A}{g^2(\overline{d})} * H(\overline{d}) * F_\Gamma\right] \quad (2)$$

where the parameters common to Eq. (1) have the same meaning referred to above, $y_\Gamma y_\Gamma$ is the displacement due to the quadrature force, and $F_\Gamma$ is the quadrature force.

From Eq. (2), it may be seen that the signal generated by the quadrature forces is subject to the same transfer function $H(\overline{d})$ of the useful signal, referred to hereinafter also as Coriolis signal (see Eq. (1) above).

The above behaviour, which is normally undesired because it is difficult to discriminate the contribution of the sought angular velocity $\Omega$ from the contribution of disturbance, is exploited in the present gyroscope to track the variation or drift of the transfer function due to disturbance and therefore to track the variation of the scale factor of the gyroscope.

Figure 3:
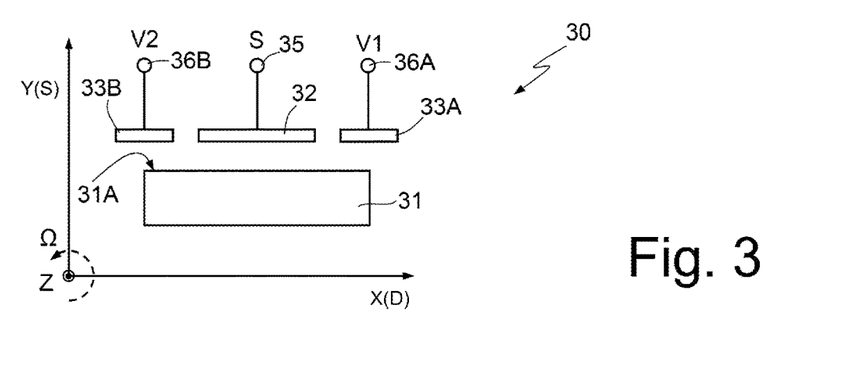
FIG. 3 shows a basic diagram of the present gyroscope.

FIG. 3 shows a gyroscope 30 exploiting the principle set forth above.

In detail, the gyroscope 30 has a general known structure and is represented in an extremely simplified way, omitting the elastic supporting systems, the biasing structures of the mobile mass, and the driving structures (fixed driving electrodes, operating according to a driving principle, as well as the corresponding electrical connections). Also here, the gyroscope 30 is described with reference to a triad of Cartesian axes XYZ.

The gyroscope 30 illustrated in FIG. 3 comprises a mobile mass 31, represented schematically as having a rectangular shape, but may be made according to any known geometry, also of a triangular, trapezoidal, or circular type. In the schematic representation illustrated in FIG. 3, the mobile mass 31 is driven, like the mobile mass 2 of FIG. 1, in a direction parallel to the first Cartesian axis X (driving direction X), the gyroscope 30 is configured to rotate about the third Cartesian axis Z in presence of an angular velocity $\Omega$ to be detected, and detection is made along the second Cartesian axis Y (sensing direction Y). What discussed below applies, however, also to driving and sensing along different axes, as evident to the person skilled in the art.

The mobile mass 31 here faces a sensing electrode 32 (and is capacitively coupled thereto) and a pair of quadrature-injection electrodes (first and second quadrature-injection electrodes 33A, 33B) through an own facing surface 31A. This arrangement is not, however, essential, and the mobile mass 31 may have different surfaces facing the sensing electrode 32 and the quadrature-injection electrodes 33A, 33B, provided that they are configured and arranged to enable detection of capacitive variations in the sensing direction Y. In particular, the sensing electrode 32 supplies a sensing signal S to an own sensing terminal 35, accessible from outside; the quadrature-injection electrodes 33A, 33B are connected to a first and, respectively, a second calibration terminals 36A, 36B receiving quadrature-injection signals V1, V2, illustrated for example in FIG. 5A.

Generally, the sensing electrode 32 has a much larger area than the quadrature-injection electrodes 33A, 33B, for example ten times larger.

In FIG. 3, the sensing electrode 32 is arranged in front of a central portion of the mobile mass 31, and therefore the facing area between the sensing electrode 32 and the facing surface 31A remains unvaried during movement of the mobile mass 31 in both the driving direction X and sensing direction Y. Instead, the first and second quadrature-injection electrodes 33A, 33B are here arranged only partially facing the facing surface 31A of the mobile mass 31; in particular, here they are arranged on opposite peripheral sides of the facing surface 31A of the mobile mass 31 and project laterally from the facing surface 31A, respectively towards the right and towards the left. In this way, as discussed below, during the driving movement of the mobile mass 31, they have a variable surface area facing the mobile mass 31; namely, the useful facing surface (i.e., useful for detecting the capacitive variation) between each quadrature-injection electrode 33A, 33B and the mobile mass 31 has a variable area due to the driving movement in the driving direction X.

Figure 5A:
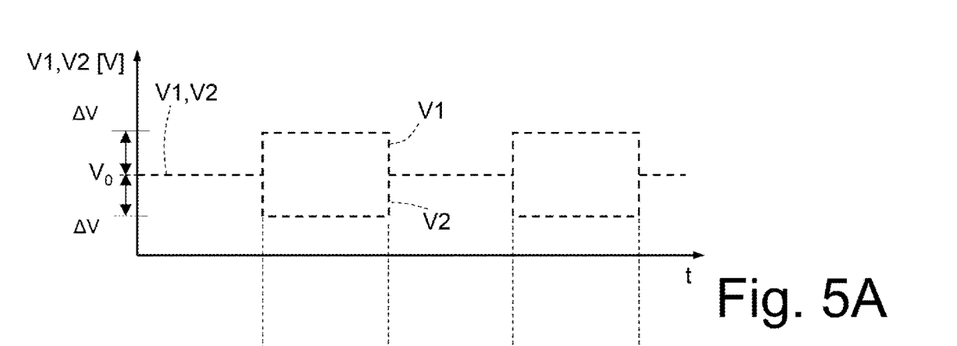
FIGS. 5A and 5B show the plots of electrical quantities in the gyroscope of FIG. 3.

In the discussed embodiment, the quadrature-injection signals V1, V2 are a.c. voltages, with quadrature-injection frequency $f_C$ different from the frequency $f_0$ of the driving signal, and opposite waveforms (see FIG. 5A). In particular, the quadrature-injection frequency $f_C$ is lower than the driving frequency $f_0$. For instance, the driving frequency $f_0$ may be 20 kHz and the quadrature-injection frequency $f_C$ may be 1 kHz. Moreover, the first and second quadrature-injection electrodes V1, V2 switch between a first value $V_0$, the same for both, in a first half-period, designated by T1 in FIGS. 5A and 5B, and a second value, different for V1, V2, in a second half-period, designated by T2. The second value is $V_0+\Delta V_0$ for the first quadrature-injection signal V1 and $V_0-\Delta V_0$ for the second quadrature-injection signal V2, where $V_0$ is typically lower than the biasing voltage of the mobile mass 31 (for example, one half) and the voltage step $\Delta V_0$ is a fraction of the first value, for example one tenth of $V_0$ ($\Delta V_0=0.1\ V_0$). Consequently, during the first half-period T1, the potential difference between the quadrature-injection electrodes 33A, 33B and the mobile mass 31 is the same and no quadrature force is generated (first quadrature force zero). Instead, during the second half-period T2, the quadrature-injection electrodes 33A, 33B have a potential difference increased and, respectively, reduced by $\Delta V_0$ with respect to the mobile mass 31 and generate an additional force (with positive or negative sign, depending on the instantaneous position occupied by the mobile mass 31), which acts on the mass, as explained below with reference to FIGS. 5A and 5B (second quadrature force).

Figure 4A:
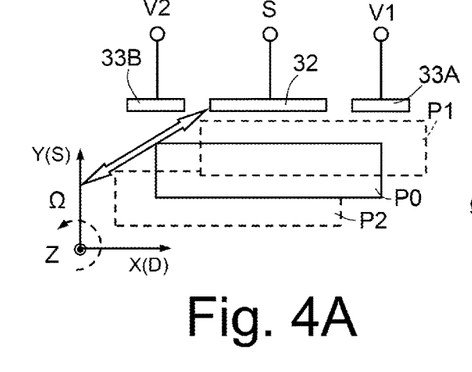
FIGS. 4A and 4B show the movement of the gyroscope of FIG. 3 in a first operating step and, respectively, in a second operating step, in absence of angular velocity.
Figure 4B:
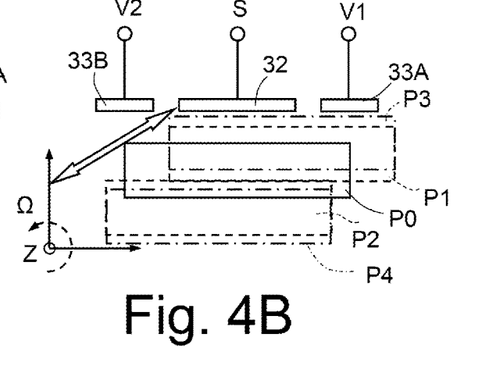

FIGS. 4A and 4B show the behaviour of the mobile mass 31 in the two half-periods T1, T2 in presence of the quadrature-injection signals V1, V2.

Figure 5B:
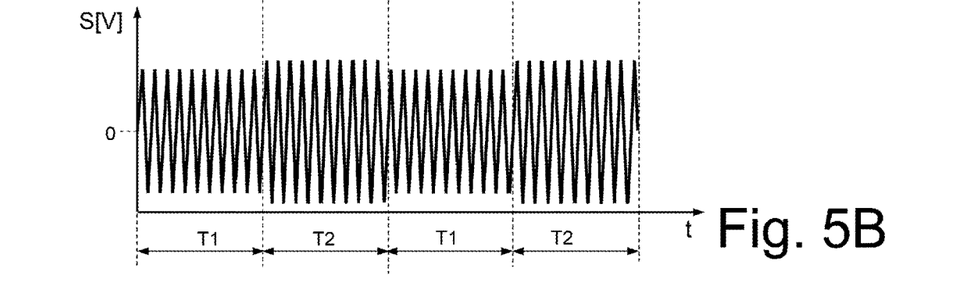

In detail, FIG. 4A shows the movement of the mobile mass 31 in the first half-period T1, in presence of the driving signal and of a natural quadrature (and/or an angular velocity $\Omega$) and with calibration terminals 36A, 36B biased at the first value $V_0$. In particular, FIG. 4A shows with a solid line P0 the intermediate position (also corresponding to the rest position of the mobile mass 31) and, with dashed lines, two possible maximum oscillation positions of the mobile mass 31 (first elongation position P1, corresponding to the maximum closeness to the electrodes 32, 33A, 33B, and second elongation position P2, corresponding to the maximum distance from the electrodes 32, 33A, 33B). Consequently, in the first half-period T1 no quadrature signal (calibration quadrature signal) is applied or injected. The corresponding plot of the sensing signal S in the first half-period T1 is illustrated in FIG. 5B; in particular, in the first half-period T1, the sensing signal S has a sinusoidal plot, at the driving frequency $f_0$ with a first amplitude related to the natural quadrature (and possibly to the angular velocity $\Omega$), in a per se known manner.

FIG. 4B shows the movement of the mobile mass 31 in the second half-period T2, in presence of the driving signal and of the natural quadrature (and/or of the angular velocity $\Omega$) and with calibration terminals 36A, 36B set at voltage $V_0+\Delta V_0$ and, respectively, $V_0-\Delta V_0$. In particular, FIG. 4B shows again with a solid line the intermediate position P0 of the mobile mass 31, with dashed lines the maximum oscillation positions P1, P2 of FIG. 4A, and with dashed-and-dotted lines two possible maximum oscillation positions P3, P4 of the mobile mass 31 in presence of voltage step $\pm\Delta V_0$.

As may be noted, in the second half-period T2, when the mobile mass 31 is in the first elongation position P1 (position of maximum elongation to the right and of minimum distance from the electrodes 32, 33A, 33B), it completely faces here the first quadrature-injection electrode 33A (set at voltage $V_0+\Delta V_0$) but no longer faces the second quadrature-injection electrode 33B (set at voltage $V_0-\Delta V_0$). It therefore undergoes an additional force (positive calibration quadrature force) which amplifies the approaching movement thereof to the electrodes 32, 33A. The mobile mass 31 consequently moves from the first elongation position P1 to the position represented by a dashed-and-dotted line, also denoted as third elongation position P3.

Analogously, in the same second half-period T2, when the mobile mass 31 is in the second elongation position P2 (position of maximum elongation to the left and of maximum distance from the electrodes 32, 33A, 33B), it completely faces the second quadrature-injection electrode 33B (set at voltage $V_0-\Delta V_0$) but no longer sees the first quadrature-injection electrode 33A (set at voltage $V_0+\Delta V_0$); it therefore undergoes a smaller force (negative calibration quadrature force), which amplifies the movement thereof away from the electrodes 32, 33A, 33B. The mobile mass 31 consequently moves from the second elongation position P2 to the position represented by a dashed-and-dotted line, also denoted as fourth elongation position P4.

It is highlighted that the same effect of applying a quadrature force in the two maximum elongation positions of the mobile mass 31 may be obtained also when the facing surfaces between the mobile mass 31 and the quadrature-injection electrodes 33A, 33B are variable differently from what shown in FIGS. 3, 4A, and 4B, as discussed below.

The increase of the elongation, positive and negative, of the mobile mass 31 in the second half-period T2 causes, as may be seen, a modification of the minimum and maximum distances of the mobile mass 31 from the sensing electrode 32 and consequently, respectively, a greater capacitive variation between them during the detection movement, with consequent increase in the amplitude of the sensing signal S, as shown in FIG. 5B; as may be noted, in the second half-period T2, the sensing signal S has still a sinusoidal waveform with the same frequency as in the first half-period T1, but a second amplitude, greater than the first amplitude.

In practice, in the second half-period T2, a quadrature signal of a known value is injected and gives rise to a step $\Delta S$, which is measurable, in the amplitude of the sensing signal S. The step $\Delta S$ may vary in time in presence of variable disturbance and drift and is related to the transfer function H(d) of Eqs. (1) and (2).

By monitoring the value variations of the step $\Delta S$ in time, it is thus possible to detect any variations of the scale factor; moreover, it is possible to obtain a correction factor of the scale factor, which may be used in a compensation processing system.

Figure 6:
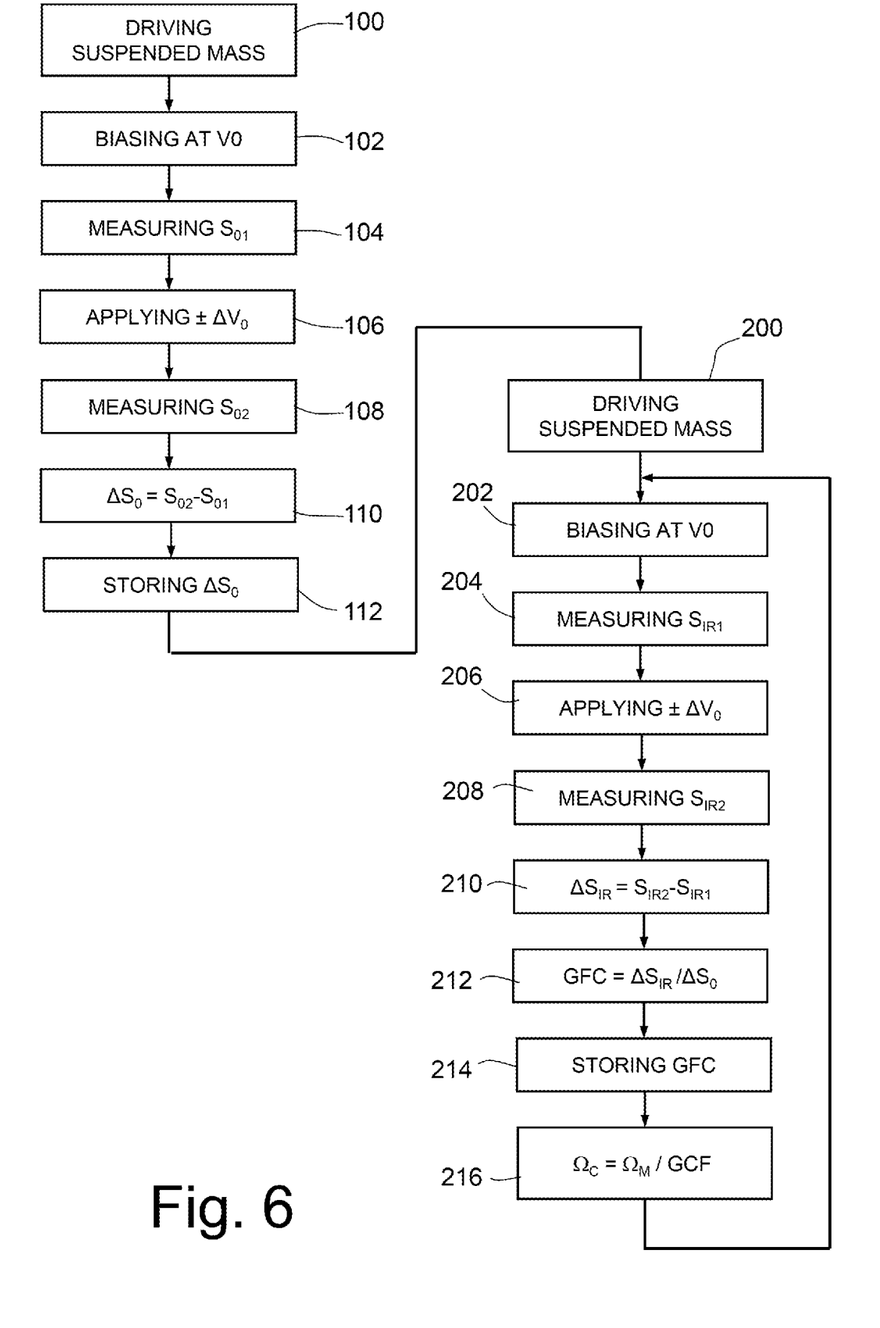
FIG. 6 shows a flowchart regarding the present calibration method.

A flowchart of a method for detecting and correcting variations of the scale factor is illustrated in FIG. 6.

In detail, the method of FIG. 6 comprises an initial sensing step, normally carried out in the factory, during the gyroscope final verification and testing operations, and a detection and correction step, carried out in a continuous way or at preset intervals during gyroscope operation, without, however, requiring interrupting operation thereof and in particular without interrupting the flow of angular-velocity output signals supplied to an electronic apparatus that uses them.

In detail, the initial sensing step comprises driving the mobile mass 31 at the preset driving frequency $f_0$, step (100); initially biasing the quadrature-injection electrodes 33A, 33B at the first value $V_0$ of the quadrature-injection signals V1, V2, as illustrated in FIG. 5A during the first half-period T1, step 102; measuring a first reference value $S_{01}$ of the sensing signal S, step 104; applying the calibration-voltage step $\pm \Delta V_0$, as illustrated in FIG. 5A during the second half-period T2, step 106; measuring a second reference value $S_{02}$ of the sensing signal S, step 108; subtracting the first from the second reference value $S_{02}-S_{01}$ to obtain a reference deviation value $\Delta S_0$, step 110; and storing the reference-calibration scale factor $\Delta S_0$, step 112.

In detail, the detection and correction step comprises driving the mobile mass 31 at the preset driving frequency $f_0$, step 200; biasing the quadrature-injection electrodes 33A, 33B at the first value $V_0$ of the quadrature-injection signals V1, V2 as illustrated in FIG. 5A during the first half-period T1, step 202; measuring a first half-period value $S_{IR1}$ of the sensing signal, step 204; applying the calibration-voltage step $\pm \Delta V_0$, as illustrated in FIG. 5A during the second half-period T2, step 206; measuring a second half-period value $S_{IR2}$ of the sensing signal S, step 208; subtracting the first half-period value from the second half-period value $S_{IR2}-S_{IR1}$ to obtain an inrun deviation value $\Delta S_{IR}$, step 210; calculating a gain-correction factor GCF as the ratio between the inrun deviation value $\Delta S_{IR}$ and the reference calibration deviation value $\Delta S_0$, according to the equation:

$$GCF = \Delta S_{IR}/\Delta S_0 \quad (3)$$

step 212; storing the correction factor GCF, step 214; and correcting the angular-velocity value $\Omega_M$ measured and calculated in a standard way by dividing it by the correction factor GCF, according to the equation:

$$\Omega_C = \Omega_M/GCF \quad (4)$$

step 216.

The steps 202-214 for detecting the correction factor GCF can thus be repeated at the frequency $f_C$ of the quadrature-injection signals V1, V2 of FIG. 5A, or repeated at preset time intervals, as indicated.

Figure 7:
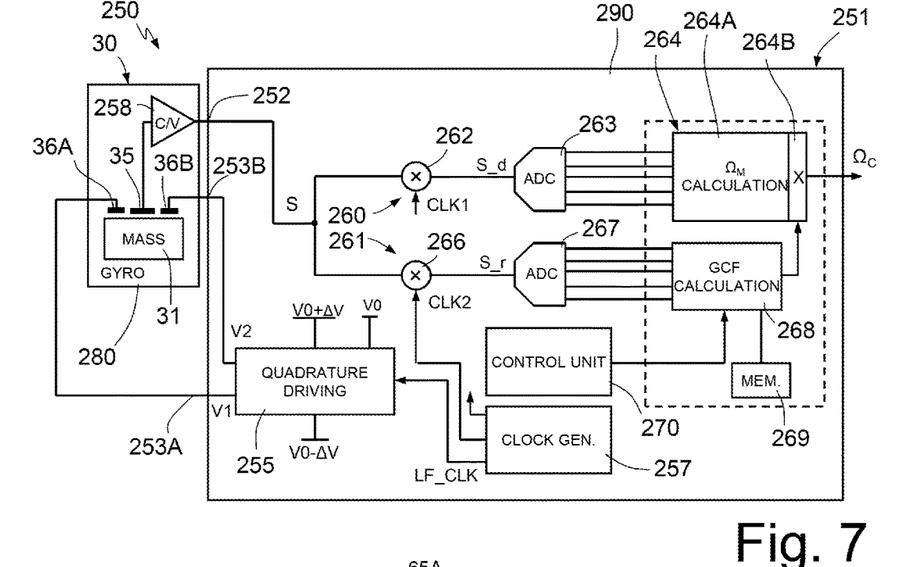
FIG. 7 shows a principle electrical diagram of a control circuit of the gyroscope of FIG. 3.

FIG. 7 shows a block diagram of an angular-velocity sensing system, designated as a whole by 250.

The angular-velocity sensing system 250 comprises the gyroscope 30 of FIG. 3 and an electronic processing unit 251, for example, an ASIC (application-specific integrated circuit), of both of which only the components useful for understanding the method for detecting and correcting scale factor variations described above with reference to FIG. 6 are illustrated. The control unit for the driving movement of the mobile mass 31 is therefore not shown.

In the illustrated embodiment, the gyroscope 30 and the electronic processing unit 251 are here formed on two separate chips 280, 290, for example, arranged side-to-side or on top on a printed circuit board or packaged in a single package.

In FIG. 7, the sensing terminal 35 of the gyroscope 30 is electrically coupled to a capacitance/voltage converter 258 that generates the sensing signal S. The output of the capacitance/voltage converter 258 is connected to a signal input terminal 252 of the processing unit 251. The calibration terminals 36A, 36B are electrically coupled, through respective biasing terminals 253A, 253B, to a quadrature-injection control unit 255 of the processing unit 251. The quadrature-injection control unit 255 receives, from a voltage source or a charge pump (not shown), the voltages $V_0$, $V_0-\Delta V$ and $V_0+\Delta V$ and, based on a low-frequency clock signal LF_CLK, generated by a clock generator 257, supplies the quadrature-injection signals V1, V2 at the frequency of the low-frequency clock signal LF_CLK having the period T1+T2.

The signal input terminal 252 of the processing unit 251 is coupled to an angular-velocity calculation channel 260, for processing the Coriolis signal, and to a scale correction factor calculation channel 261.

The angular-velocity calculation channel 260 and the scale correction factor calculation channel 261 are similar to each other. In particular, the angular-velocity calculation channel 260 has a standard structure and comprises a signal demodulator 262 and an analog-to-digital signal converter 263. In particular, the signal demodulator 262 multiplies the sensing signal S (voltage signal) by a first clock signal CLK1, having a frequency equal to the frequency $f_0$ of the driving signal of the gyroscope 30. The demodulated sensing signal S_d thus obtained (possibly filtered, for eliminating higher harmonics, in a per se known manner) is digitised in the analog-to-digital signal converter 263 and supplied to an angular-velocity calculation block 264.

The angular-velocity calculation block 264 comprises a calculation portion 264A of a known type, which supplies a measured angular-velocity value $\Omega_M$, and a correction portion 264B basically formed by a multiplier, as explained below.

For instance, in a typical embodiment, the calculation portion 264A may be a digital signal processor (DSP) comprising the following main standard blocks: a SINC filter for sampling the data coming from the analog-to-digital converter, a digital compensation unit (DCU) for regulating sensitivity (in addition to possible other parameters), and additional digital filters (of a FIR—Finite Impulse Response type or IIR—Infinite Impulse Response type) for reducing the output noise. In the present application, sensitivity compensation within the DCU also depends upon the output of the GCF blocks, thus enabling real time regulation of the gain.

The scale correction factor calculation channel 261 comprises a quadrature demodulator 266, a quadrature analog-to-digital converter 267, a scale correction factor calculation block 268 and a memory 269. In detail, the quadrature demodulator 266 multiplies the sensing signal S by a clock signal CLK2=CLK1+90°, having a frequency $f_0$ equal to the frequency of the first clock signal CLK1, but phase-shifted by 90°, to take into account the phase shift of the quadrature-injection signals V1, V2 with respect to the Coriolis signal. The demodulated quadrature signal S_r thus obtained (possibly filtered, to eliminate higher harmonics, in a per se known manner) is digitised in the quadrature analog-to-digital converter 267 and supplied to the scale correction factor calculation block 268, which, based on the ratio between the scale factor stored in the memory 269 during trimming and the scale factor just calculated, determines the correction factor GCF according to Eq. (3).

The correction factor GCF is then supplied to the angular-velocity calculation block 264 based on an activation signal supplied by a control unit 270.

The calculation portion 264A of the angular-velocity calculation block 264 then processes the demodulated and digitised sensing signal S_d in a known way to obtain the measured angular velocity $\Omega_M$ and multiplies the measured angular velocity $\Omega_M$ by the correction factor GCF in the correction portion 264B according to Eq. (4), outputting the corrected angular-velocity value $\Omega_C$.

If the gyroscope 50 is triaxial or the processing unit 251 is coupled to three uniaxial gyroscopes 50, the angular-velocity calculation channel 260 and the scale correction factor calculation channel 261 are repeated for each roll, pitch, and yaw movement.

Figure 8:
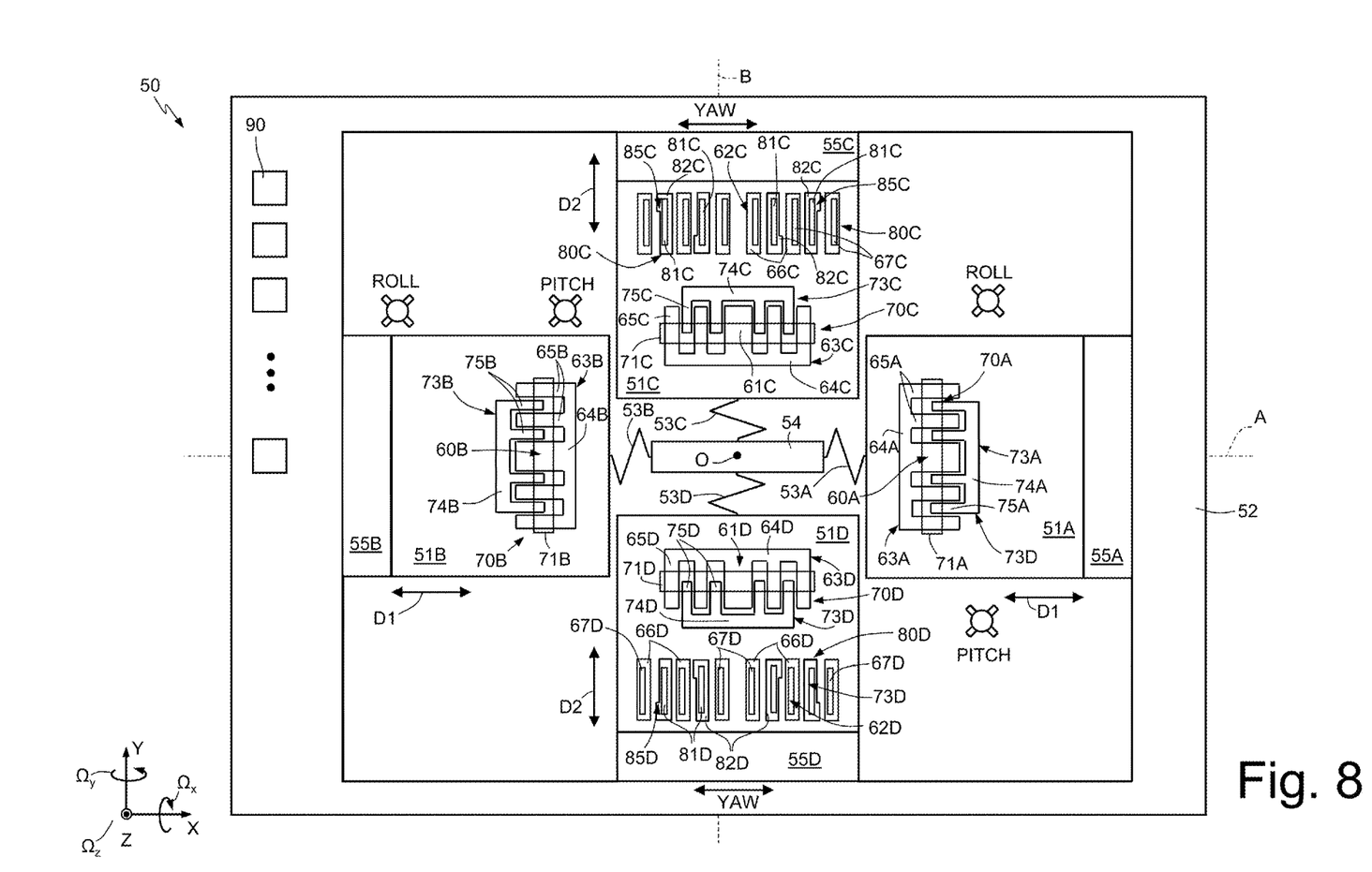
FIG. 8 shows a possible embodiment of the gyroscope of FIG. 3.

FIG. 8 shows a possible implementation of the calibration electrodes for a gyroscope 50 of a triaxial type for detecting angular velocity about a first, a second and a third Cartesian axis X, Y, Z, respectively, (yaw, roll, and pitch movements, respectively).

In detail, the gyroscope 50 comprises a first, a second, a third and a fourth mobile mass 51A, 51B, 51C, 51D carried by a fixed structure 52 (represented only schematically) by a system of flexures 53A-53D, which couple each respective mobile mass 51A, 51B, 51C, and 51D to a central anchoring element 54, rigid with the fixed structure 52 and shown only schematically. Contact pads 90 are formed on the fixed structure 52 for electrically connecting the structures of the gyroscope 50 in a way known to the person skilled in the art and not represented in detail herein.

The gyroscope 50 of FIG. 8 has a structure that is approximately symmetrical with respect to two central axes A and B passing through a centre O of the gyroscope and parallel to a first Cartesian axis X and, respectively, a second Cartesian axis Y of a Cartesian axes system XYZ. In particular, the first and second masses 51A, 51B are arranged symmetrically with respect to the second central axis B, and the third and fourth masses 51C, 51D 51B are arranged symmetrically with respect to the first central axis A. Moreover, the first and second masses 51A, 51B have a symmetrical conformation with respect to the first central axis A, which traverses them centrally, and the third and fourth masses 51C, 51D 51B have a conformation to a first approximation symmetrical with respect to the second central axis B, which traverses them centrally. The third and fourth masses 51C, 51D differ only as regards the shape and position of the yaw-sensing electrodes and of the associated quadrature-injection electrodes, as discussed below.

Each mobile mass 51A-51D is coupled to a respective driving structure 55A-55D, shown only schematically and of a known type, which sets in oscillation the respective mobile mass 51A-51D in a driving direction. In detail, in the gyroscope 50 shown, the first and second mobile masses 51A, 51B are driven in a direction parallel to the first Cartesian axis X, as represented by first arrows D1, and the third and fourth mobile masses 51C, 51D are driven in a direction parallel to the second Cartesian axis Y, as represented by second arrows D2. For instance, the driving structures 55A-55D may be formed by a so-called capacitive comb finger actuation.

In the gyroscope 50 of FIG. 8, the first and second mobile masses 51A, 51B comprise a first and, respectively, a second roll-sensing structure 60A, 60B intended to detect the roll movement of the gyroscope 50 about the second Cartesian axis Y. In practice, the first and second sensing structures 60A, 60B detect the movement of the respective mobile mass 51A, 51B in a roll sensing direction Roll parallel to the third Cartesian axis Z, which movement is caused by the Coriolis force acting on the respective mobile mass 51A, 51B in presence of an angular velocity $\Omega_Y$ and due to the driving of the suspended masses 51A, 51B in the first direction D1.

To this end, the first and second roll-sensing structures 60A, 60B comprise a first and, respectively, a second roll sensing electrode 63A, 63B, of conductive material, extending over a substrate not visible in FIG. 8 (parallel to the suspended masses 51A-51D in a plane set behind the drawing plane) and facing the respective mobile mass 51A, 51B. Each roll sensing electrode 63A, 63B is here formed by a transverse portion 64A, respectively 64B, extending perpendicularly to the first driving direction D1 and parallel to the second Cartesian axis Y, and by a respective plurality of arms 65A, 65B, extending parallel to each other and to the first driving direction D1 and are connected to the respective transverse portion 64A, 64B.

The third and fourth mobile masses 51C, 51D comprise a first and second a pitch sensing structure 61C, 61D and a first and a second yaw sensing structure 62C, 62D.

In particular, the first and second pitch sensing structures 61C, 61D are able to detect the pitch movement of the gyroscope 50 about the first Cartesian axis X. In practice, the first and second pitch sensing structures 61C, 61D detect the movement of the respective mobile mass 51C, 51D in a pitch sensing direction Pitch parallel to the third Cartesian axis Z, which movement is caused by the Coriolis force acting on the respective mobile mass 51C, 51D in presence of an angular velocity $\Omega_X$ and due to the driving of the suspended masses 51A, 51B in the second direction D2.

The first and second pitch sensing structures 61C, 61D have a structure similar to the first and second roll sensing structures 60A, 60B, but are rotated through 90° with respect to the latter. Consequently, they comprise a first and, respectively, a second roll sensing electrode 63C, 63D, of conductive material, extending over the substrate (not visible) and facing the respective mobile mass 51C, 51D. Each roll sensing electrode 63C, 63D is therefore formed by a transverse portion 64C, respectively 64D, which extends in perpendicularly to the second driving direction D2 and parallel to the first Cartesian axis X, and by a respective plurality of arms 65C, 65D, which extend parallel to each other and to the second driving direction D2 and are connected to the respective transverse portion 64C, 64D.

The first and second yaw sensing structures 62C, 62D are designed to detect the movement of the gyroscope 50 about the third Cartesian axis Z (in-plane movement). In practice, the first and second yaw sensing structures 62C, 62D detect the movement of the respective mobile mass 51C, 51D in a yaw sensing direction Yaw parallel to the first Cartesian axis X, which movement is caused by the Coriolis force acting on the respective mobile mass 51C, 51D in presence of an angular velocity $\Omega_z$ and due to the driving of the suspended masses 51A, 51B in the second direction D2.

Figure 8A:
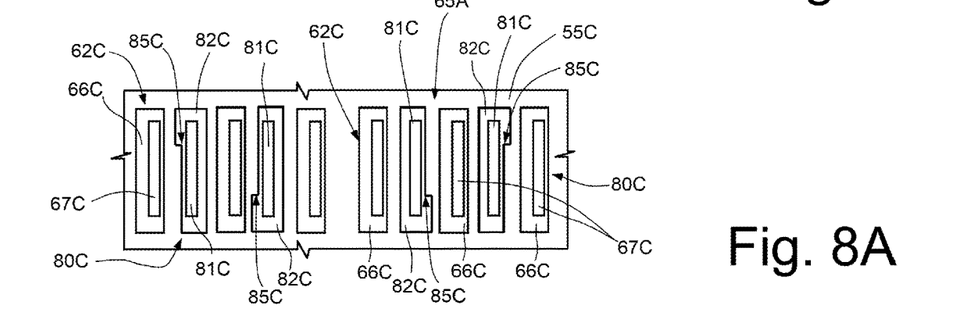
FIG. 8A shows an enlarged detail of the gyroscope of FIG. 8.

The first and second yaw sensing structures 62C, 62D, visible more clearly in the detail of FIG. 8A at an enlarged scale, comprise first and, respectively, second yaw sensing openings 66C, 66D formed in the mobile masses 51C, respectively 51D, and first and second yaw sensing electrodes 67C, 67D, of conductive material, rigid with the fixed structure 51 and extending from the substrate (not visible) in a vertical direction (parallel to the third Cartesian axis Z) within the first and, respectively second yaw sensing openings 66C, 66D.

In the embodiment illustrated, the first and second yaw sensing openings 66C, 66D have (in top plan view) a generally elongated rectangular shape, with length parallel to the second Cartesian axis Y (parallel to the second driving direction D2). Analogously, the first and second yaw-sensing electrodes 67C, 67D have (in top plan view) an elongated rectangular shape, with their length parallel to the second Cartesian axis Y. At rest, the first yaw sensing electrodes 67C are arranged in the respective first yaw sensing openings 66C in an off-centre position and precisely arranged closer to a first longer side of the first yaw sensing openings 66C (in FIG. 8, closer to the right-hand side) than to the opposite longer side. Instead, the second yaw-sensing electrodes 67D are arranged in the respective second yaw sensing openings 66D in an off-centre position and precisely arranged closer to the longer side thereof opposite with respect to the first yaw sensing electrodes 67C (in FIG. 8, closer to the left-hand side).

Moreover, the gyroscope 50 comprises a first and a second roll quadrature-injection structure 70A, 70B, associated to the first mobile mass 51A and to the second mobile mass 51B, respectively; a first and a second pitch quadrature-injection structure 70C, 70D, associated to the third mobile mass 51C and to the fourth mobile mass 51D, respectively; and a first and a second yaw quadrature-injection structure 80C, 80D, associated to the third mobile mass 51C and to the fourth mobile mass 51D, respectively.

The roll and pitch quadrature-injection structures 70A-70D are similar to each other, but rotated through 90° with respect to each other. In particular, the first roll quadrature-injection structure 70A, 70B comprises a first roll quadrature-injection opening 71A and a first roll quadrature-injection electrode 73A; the second roll quadrature-injection structure 70A comprises a second roll quadrature-injection opening 71B and a second roll quadrature-injection electrode 73B; the first pitch quadrature-injection structure 70C comprises a first pitch quadrature-injection opening 71C and a first pitch quadrature-injection electrode 73C; and the second pitch quadrature-injection structure 70D comprises a second pitch quadrature-injection opening 71D and a second pitch quadrature-injection electrode 73D.

In detail, the roll and pitch quadrature-injection electrodes 73A-73D have a shape similar to the roll and pitch sensing electrodes 63A, 63B, 63C, 63D; in particular, in the embodiment shown, they are arranged adjacent to the homologous sensing electrodes 63A-63D, in an overturned position. Consequently, each roll and pitch quadrature-injection electrode 73A, 73B, 73C and 73D has a respective transverse portion 74A, 74B, 74C, 74D and a respective plurality of arms 75A, 75B, 75C, 75D. The transverse portions 74A, 74B, 74A, 74D of the roll and pitch quadrature-injection electrode 73A, 73B, 73C and 73D extend perpendicularly to the driving direction D1, D2 of the respective mobile mass 51A-51D. The arms 75A-75D of each roll and pitch quadrature-injection electrode 73A-73D extend parallel to each other, perpendicular to the respective transverse portion 74A-74D and are comb-fingered with the arms 65A-65D of the corresponding roll and pitch sensing electrodes 63A-63D. In this way, the centroids of the roll and pitch quadrature-injection electrodes 73A-73D are close to the centroids of the respective roll- and pitch-sensing electrodes 63A, 63B, 63C, 63D.

Moreover, each quadrature-injection opening 71A, 71B, 71C, and 71D has an elongated rectangular shape perpendicular to the driving direction of the respective mobile mass 51A-51D.

In the gyroscope 50, in the rest position, the quadrature-injection openings 71A-71D extend above the ends of the arms 75A-75D of the respective quadrature-injection electrodes 73A-73D and above intermediate portions of the arms 65A-65D of the respective sensing electrodes 63A-63D. In particular, the quadrature-injection openings 71A-71D, the sensing electrodes 63A-63D, and the quadrature-injection electrodes 73A-73D are arranged with respect to each other and sized so that, according to the oscillation position of the respective mobile mass 51A-51D, each quadrature-injection opening 71A-71D always overlies the arms 65A-65D of the respective sensing electrodes 63A-63D, and overlies completely, partially, or does not overlie at all the arms 75A-75D of the respective quadrature-injection electrodes 73A-73D. Thereby, the facing area between each sensing electrode 63A-63D and the respective mobile mass 51-53 does not change with the position of the latter, whereas the facing area between each mobile mass 51A-51D and the arms 75A-75D of the respective quadrature-injection electrodes 73A-73D does vary, as shown in detail in FIGS. 9A and 9B for the second roll quadrature-injection structure 63B.

Figure 9A:
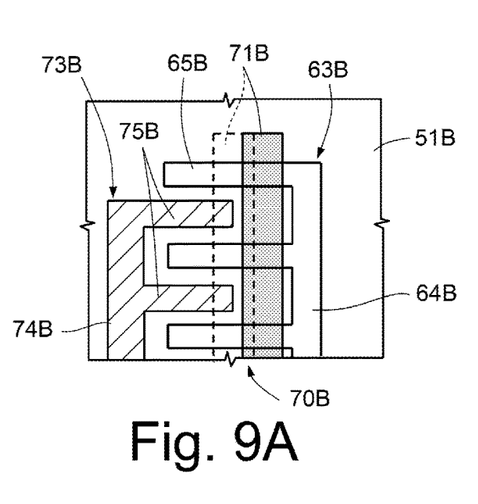
FIGS. 9A and 9B show enlarged details of the gyroscope of FIG. 8.
Figure 9B:
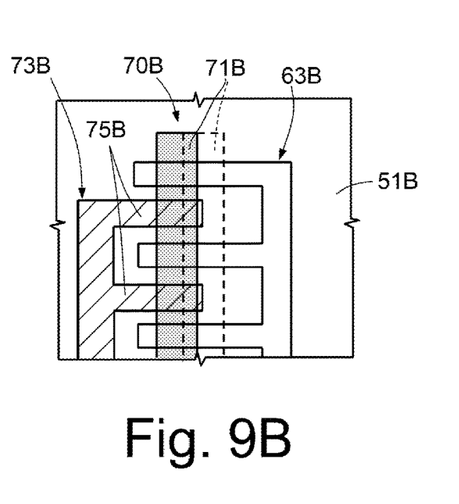

In particular, FIG. 9A shows one half of the second roll quadrature-injection structure 70B; more in particular, FIG. 9A represents with a dashed line the roll quadrature-injection opening 71B in the rest position of the second mobile mass 51B and with a solid line the roll quadrature-injection opening 71B in the position of maximum elongation to the right of the second mobile mass 51B. FIG. 9B analogously shows with a dashed line the roll quadrature-injection opening 71B in the rest position of the second mobile mass 51B and with a solid line the roll quadrature-injection opening 71B in the position of maximum elongation to the left of the second mobile mass 51B.

As may be noted, in the dashed rest position of FIGS. 9A and 9B, the roll quadrature-injection opening 71B overlies for only part of its width (in a direction parallel to the first Cartesian axis X) the arms 75B of the second roll quadrature-injection electrode 73B. In the position of maximum elongation to the right of the second mobile mass 51B, the roll quadrature-injection opening 71B (represented with a solid line in FIG. 9A and highlighted in grey) does not overlie the arms 75B of the second roll quadrature-injection electrode 73B. Finally, in the position of maximum elongation to the left of the second mobile mass 51B, the roll quadrature-injection opening 71B (represented with a solid line in FIG. 9B and highlighted in grey) overlies for all its width the arms 75B of the second roll quadrature-injection electrode 73B. Consequently, in the rest position of the second mobile mass 51B, the area mutual facing between the second mobile mass 51B and the second roll quadrature-injection electrode 73B has an intermediate value. In the position of maximum elongation to the right of the second mobile mass 51B (FIG. 9A), the mutual facing area between the second mobile mass 51B and the second roll quadrature-injection electrode 73B has a maximum value. Finally, in the position of maximum elongation to the left of the second mobile mass 51B (FIG. 9B), the mutual facing area between the second mobile mass 51B and the second roll quadrature-injection electrode 73B has a minimum value.

In this way, by applying, for example, the first quadrature-injection signal V1 to the second roll quadrature-injection electrode 73B and to the first pitch quadrature-injection electrode 73C, and the second quadrature-injection signal V2 to the first roll quadrature-injection electrode 73A and to the second pitch quadrature-injection electrode 73D, injection of respective roll and pitch quadrature forces is obtained analogously to what described with reference to FIGS. 4A, 4B, 5A, 5B and 6.

The yaw quadrature-injection structures 80C, 80D comprise a plurality of first and second yaw quadrature-injection electrodes 81C, 81D, respectively, and a corresponding plurality of first and, respectively, second yaw quadrature-injection openings 82C, 82D. In the present embodiment, the yaw quadrature-injection structures 80C, 80D are interleaved, respectively, with the first and the second yaw-sensing structure 62C, 62D, as may be noted in particular for the first yaw quadrature-injection structure 80C and the first yaw-sensing structure 62C, shown at an enlarged scale in FIG. 8A.

In detail, the first and second yaw quadrature-injection openings 82C, 82D extend side-to-side to the first and second yaw sensing openings 66C, 66D. For instance, in the shown embodiment, in the third mobile mass 51C, the first and second yaw quadrature-injection openings 82C, 82D extend each between first two pitch sensing openings 66C. Instead, in the fourth mobile mass 51D, the first and second yaw quadrature-injection openings 82C, 82D extend each between two second pitch sensing openings 66D. The first and second yaw quadrature-injection openings 82C, 82D have an elongated shape parallel to the second driving direction D2, but have a step 85C, respectively 85D, on opposite longer sides. In particular, each first yaw quadrature-injection opening 82C has a step 85C on a first longer side (here the left-hand side) thereof, and each second yaw quadrature-injection opening 82D has a step 85D on a second longer side (here the right-hand side) thereof. For instance, the first and second yaw quadrature-injection openings 82C, 82D may be alternated with each other.

The first yaw quadrature-injection electrodes 81C and second yaw quadrature-injection electrodes 81D are of conductive material, are rigid with respect to the fixed structure 52, and extend from the substrate (not visible) in a vertical direction (parallel to the third Cartesian axis Z) within the first yaw quadrature-injection openings 82C and, respectively second yaw quadrature-injection openings 82D.

Moreover, the first yaw quadrature-injection electrodes 81C and second yaw quadrature-injection electrodes 81D have (in top plan view) an elongated rectangular shape, with length parallel to the second driving direction D2. The first yaw quadrature-injection electrodes 81C are arranged in the respective first yaw quadrature-injection openings 82C close to the longer sides having the steps 85C. The second yaw quadrature-injection electrodes 81D are arranged in the respective second yaw quadrature-injection openings 82D close to the longer sides having the steps 85D.

In use, the first and second yaw quadrature-injection electrodes 81C, 81D receive the second quadrature-injection signal V2 and, respectively, the first quadrature-injection signal V1, and, in presence of a yaw angular velocity $\Omega_Z$ (about the third Cartesian axis Z), as a result of the movement of the third and fourth mobile masses 51C, 51D in the second driving direction D2, are at a variable distance from the respective longer side (in direction X).

In addition, as a result of the steps 85C, 85D, during the driving movement of the third and fourth mobile masses 51C, 51D in the second driving direction D2, the first and second yaw quadrature-injection electrodes 81C, 81D have a facing area, with the projecting portion of the respective adjacent longer side, of a value variable between a minimum and a maximum and therefore behave as described above with reference to FIGS. 5A, 4B, 5A, 5B, and 6, injecting, in the second half-periods T2, a variable quadrature force, according to the above.

In this way, the gyroscope 50 can be monitored as regards the drift of the scale factor, in all the angular-velocity sensing directions.

With the described gyroscope, it is thus possible to regulate the scale factor in run time, without interrupting the operation thereof.

Regulation does not require measurement of the disturbance inside or outside the chip 280 of the MEMS gyroscope nor the knowledge of the nature of the above disturbance; moreover, it may follow the drift of the scale factor.

Finally, it is clear that modifications and variations may be made to the gyroscope and to the scale factor correction method described and illustrated herein, without departing from the scope of the present disclosure, as defined in the attached claims. For instance, the various embodiments described may be combined to provide further solutions.

Moreover, in the triaxial gyroscope of FIG. 8, the roll and pitch quadrature-injection structures 70A-70D may be replicated so that each mobile mass 51A-51B faces both the first and second quadrature-injection electrodes 73A-73D, as for the first and second quadrature-injection electrodes 33A, 33B of FIG. 4. In this case, the first and second quadrature-injection electrodes 73A and 73B (or 73C and 73D) may be arranged side-to-side, and the roll or pitch quadrature-injection openings 71A and 71B (or 71C and 71D) for the first and second quadrature-injection electrodes 73A and 73B (or 73C and 73D) may be different quadrature-injection openings or a same quadrature-injection opening. Vice versa, the yaw quadrature-injection structures 80C, 80D may be arranged on different mobile masses 51C, 51D so that a mobile mass (for example, the mobile mass 51C) faces only first quadrature-injection electrodes 81C (receiving the second quadrature-injection signal V2) and the other mobile mass (for example, the mobile mass 51D) faces only second quadrature-injection electrodes 81D (receiving the first quadrature-injection signal V1).

The mutually facing positions between the suspended masses 51A-51D, and the roll and pitch quadrature-injection electrodes 73A-73D may vary with respect to what is shown and be associated (in the position of maximum elongation) to two different conditions, among which: a condition where each quadrature-injection opening 71A-71D overlies the respective quadrature-injection electrode 73A-73D throughout its width (or length); a condition where each quadrature-injection opening 71A-71D overlies only partially the respective quadrature-injection electrode 73A-73D; and a condition where each quadrature-injection opening 71A-71D does not overly the respective quadrature-injection electrode 73A-73D.

Finally, even though the MEMS gyroscope 30, 50 of FIGS. 4 and 8 has been described as integrated in a chip 280 separate from chip 290 integrating the electronic processing unit 251 of FIG. 7, the MEMS gyroscope 30, 50 and the electronic processing unit 251 may be formed in just one chip or some components of the electronic processing unit 251 may be formed directly in the chip 280 integrating the MEMS gyroscope 30, 50.

The step-like structure 85 of the major sides of the first and second yaw quadrature-injection openings 82C, 82D may be formed on the roll and pitch quadrature-injection electrodes 73A-73D.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS gyroscope, comprising:
a supporting structure;
a first mobile mass carried by the supporting structure and configured to move in a first driving direction and in a first sensing direction, perpendicular to each other;
a first driving structure coupled to the first mobile mass and configured to drive a movement of the first mobile mass in the first driving direction at a driving frequency;
a quadrature-injection structure coupled to the first mobile mass and configured to selectively generate a first quadrature movement of the first mobile mass in the first sensing direction in a first calibration half-period of a period and selectively generate a second quadrature movement of the first mobile mass in the first sensing direction in a second calibration half-period of the period;
a first movement sensing structure coupled to the first mobile mass and configured to detect a movement of the first mobile mass in the first sensing direction, the first movement-sensing structure being configured to supply a sensing signal having an amplitude switching between a first value and a second value that depend upon movement of the first mobile mass as a result of an external angular velocity and of the first and second quadrature movements; and
a processing unit coupled to the first movement sensing structure and configured to determine a difference between the first and second values of the sensing signal, determine a gain-correction factor based on the difference between the first and second values and a stored reference calibration scale factor, and adjust a measurement of the external angular velocity with the gain-correction factor.

2. The MEMS gyroscope according to claim 1, wherein:
a biasing structure configured to bias the quadrature-injection structure, the biasing structure being coupled to the quadrature-injection structure and being configured to bias the quadrature-injection structure at a voltage switching between a resting value in the first calibration half-period and a quadrature-injection value in the second calibration half-period.

3. The MEMS gyroscope according to claim 2, wherein:
the quadrature-injection structure comprises a first quadrature-injection electrode and a second quadrature-injection electrode coupled to the first mobile mass;
the biasing structure is configured to supply a first quadrature-injection signal to the first quadrature-injection electrode and a second quadrature-injection signal to the second quadrature-injection electrode; and
the first and second quadrature-injection signals each have first and second values, the first values of the first and second quadrature-injection signals being the same as each other, the second value of the first quadrature-injection signal being equal to the first value of the first and second quadrature-injection signals increased by a voltage step, and the second value of the second quadrature-injection signal being equal to the first value of the first and second quadrature-injection signals decreased by the voltage step.

4. The MEMS gyroscope according to claim 3, wherein the first and second quadrature-injection electrodes have a variable facing area with the first mobile mass during movement of the first mobile mass in the first driving direction.

5. The MEMS gyroscope according to claim 4, wherein:
the first mobile mass is chosen between a roll sensing mass and a pitch sensing mass;
the first quadrature-injection electrode extends underneath the first mobile mass; and
the first mobile mass has a first quadrature-injection opening configured to move between two different facing positions with respect to the first quadrature-injection electrode during movement in the first driving direction.

6. The MEMS gyroscope according to claim 5, further comprising:
a second mobile mass carried by the supporting structure and configured to move in the first driving direction and in the first sensing direction;
a second driving structure coupled to the second mobile mass and configured to drive a movement of the second mobile mass in the first driving direction at the driving frequency; and
a second movement sensing structure, coupled to the second mobile mass and configured to detect a movement of the second mobile mass in the first sensing direction, wherein:
the second quadrature-injection electrode extends underneath the second mobile mass; and
the second mobile mass has a second quadrature-injection opening configured to move between two different facing positions with respect to the second quadrature-injection electrode during movement in the first driving direction.

7. The MEMS gyroscope according to claim 4, wherein:
the first mobile mass is a mobile yaw sensing mass;

the first mobile mass has a first and a second quadrature-injection opening;

the first quadrature-injection electrode extends from a fixed structure within the first quadrature-injection opening and has a surface facing the first quadrature-injection opening, one of the first quadrature-injection opening and the first quadrature-injection electrode forming a first quadrature-injection element, and another of the first quadrature-injection opening and the first quadrature-injection electrode forming a second quadrature-injection element;

the first quadrature-injection element has a first wall with a projecting portion and a recessed portion, the projecting portion and the recessed portion of the first quadrature-injection element being arranged at different distances from the second quadrature-injection element;

the second quadrature-injection electrode extends from the fixed structure within the second quadrature-injection opening, one of the second quadrature-injection opening and the second quadrature-injection electrode forming a third quadrature-injection element, and another of the second quadrature-injection opening and the second quadrature-injection electrode forming a fourth quadrature-injection element;

the third quadrature-injection element has a third wall with a projecting portion and a recessed portion, the projecting portion and the recessed portion of the third quadrature-injection element being arranged at different distances from the fourth quadrature-injection element; and during movement in the first driving direction, the first mobile mass is configured to move between two different facing conditions with the first and second quadrature-injection elements and between two different facing conditions with the third and fourth quadrature-injection elements.

8. The MEMS gyroscope according to claim 4, further comprising:

a second mobile mass carried by the supporting structure and configured to move in the first driving direction and in the first sensing direction;

a second driving structure coupled to the second mobile mass and configured to drive a movement of the second mobile mass in the first driving direction at the driving frequency; and a second movement sensing structure coupled to the second mobile mass and configured to detect a movement of the first mobile mass in the first sensing direction, wherein:

the first and second mobile masses are yaw-sensing mobile masses;

the first mobile mass has a first quadrature-injection opening;

the second mobile mass has a second quadrature-injection opening;

the first quadrature-injection electrode extends from a fixed structure within the first quadrature-injection opening and has a surface facing the first quadrature-injection opening, one of the first quadrature-injection opening and the first quadrature-injection electrode forming a first quadrature-injection element, and another of the first quadrature-injection opening and the first quadrature-injection electrode forming a second quadrature-injection element;

the second quadrature-injection electrode extends from the fixed structure within the second quadrature-injection opening, one of the second quadrature-injection opening and the second quadrature-injection electrode forming a third quadrature-injection element, and another of the second quadrature-injection opening and the second quadrature-injection electrode forming a fourth quadrature-injection element;

the first quadrature-injection element has a first wall with a projecting portion and a recessed portion, the projecting portion and the recessed portion of the first quadrature-injection element being arranged at different distances from the second quadrature-injection element;

the third quadrature-injection element has a third wall with a projecting portion and a recessed portion, the projecting portion and the recessed portion of the third quadrature-injection element being arranged at different distances from the fourth quadrature-injection element; and during movement in the first driving direction, the first mobile mass is configured to move between two different facing conditions with the first and second quadrature-injection elements, and the second mobile mass is configured to move between two different facing positions with the third and fourth quadrature-injection elements.

9. The MEMS gyroscope according to claim 1, wherein the first quadrature movement of the first mobile mass is a zero movement.

10. An electronic processing unit, comprising an angular-velocity correction circuit including:

a subtractor configured to carry out a subtraction between first and second values of a sensing signal received from a MEMS gyroscope in an initial sensing step to determine a reference calibration scale factor and to carry out another subtraction between the first and second values of the sensing signal received from the MEMS gyroscope in an operating step of the MEMS gyroscope to determine a current calibration scale factor;

a memory element configured to store the reference calibration scale factor;

a divider configured to divide the current calibration scale factor by the reference calibration scale factor to determine a gain correction factor;

an angular velocity calculation element configured to generate a measured angular velocity value; and a measure correction element configured to divide the measured angular velocity value by the gain correction factor.

11. The electronic processing unit according to claim 10, further comprising:

a signal demodulator, configured to demodulate the sensing signal with a first clock signal having a clock frequency to determine a demodulated sensing signal;

an analog-to-digital signal converter coupled to the signal demodulator and configured to supply the angular velocity calculation element with a demodulated and digitised sensing signal;

a calibration demodulator configured to demodulate the sensing signal with a second clock signal having the clock frequency and phase-shifted by 90° with respect to the first clock signal; and an analog-to-digital calibration converter, coupled to the calibration demodulator and configured to supply the first and second values of the sensing signal to the subtractor.

12. An angular velocity sensing system, comprising:
a MEMS gyroscope that includes:
- a supporting structure;
- a first mobile mass carried by the supporting structure and configured to move in a first driving direction and in a first sensing direction, perpendicular to each other;
- a first driving structure coupled to the first mobile mass and configured to drive a movement of the first mobile mass in the first driving direction at a driving frequency;
- a quadrature-injection structure coupled to the first mobile mass and configured to selectively generate a first quadrature movement of the first mobile mass in the first sensing direction in a first calibration half-period and selectively generate a second quadrature movement of the first mobile mass in the first sensing direction in a second calibration half-period;
- a first movement sensing structure coupled to the first mobile mass and configured to detect a movement of the first mobile mass in the first sensing direction, the movement-sensing structure being configured to supply a sensing signal having an amplitude switching between a first value and a second value that depend upon movement of the first mobile mass as a result of an external angular velocity and of the first and second quadrature movements; and an electronic processing unit having an angular-velocity correction circuit that includes:
- a subtractor configured to carry out a subtraction between first and second values of a sensing signal received from the MEMS gyroscope in an initial sensing step and obtain a reference calibration scale factor and to carry out a subtraction between the first and second values of the sensing signal received from the MEMS gyroscope in an operating step of the MEMS gyroscope and obtain a current calibration scale factor;
- a memory element configured to store the reference calibration scale factor;
- a divider for dividing the current calibration scale factor by the reference calibration scale factor and obtaining a gain correction factor;
- an angular velocity calculation element configured to generate a measured angular velocity value; and
- a measure correction element configured to multiply the measured angular velocity value by the gain-correction factor.

13. The angular velocity sensing system accordingly to claim 12, wherein the MEMS gyroscope includes a biasing structure configured to bias the quadrature-injection structure, the biasing structure being coupled to the quadrature-injection structure and being configured to bias the quadrature-injection structure at a voltage switching between a resting value in the first calibration half-period and a quadrature-injection value in the second calibration half-period.

14. The angular velocity sensing system accordingly to claim 13, wherein:
the quadrature-injection structure comprises a first quadrature-injection electrode and a second quadrature-injection electrode coupled to the first mobile mass;
the biasing structure is configured to supply a first quadrature-injection signal to the first quadrature-injection electrode and a second quadrature-injection signal to the second quadrature-injection electrode; and the first and second quadrature-injection signals each have first and second values, the first values of the first and second quadrature-injection signals being the same as each other, the second value of the first quadrature-injection signal being equal to the first value of the first and second quadrature-injection signals increased by a voltage step, and the second value of the second quadrature-injection signal being equal to the first value of the first and second quadrature-injection signals decreased by the voltage step.

15. The angular velocity sensing system accordingly to claim 12, wherein the first quadrature movement of the first mobile mass is a zero movement.

16. A method, comprising:
- driving a mobile mass of a MEMS gyroscope in a driving direction at a driving frequency;
- applying, during a first half-period, a first quadrature force that generates a first quadrature movement in a quadrature direction perpendicular to the driving direction;
- applying, during a second half-period, a second quadrature force that generates a second quadrature movement in the quadrature direction;
- acquiring a sensing signal having an amplitude switching between first and second values that depend upon the movement of the first mobile mass as a result of an external angular velocity and of the first and second quadrature movements;
- obtaining a current calibration scale factor based on a difference between the first and second values of the sensing signal;
- generating a gain-correction factor based on the current calibration scale factor;
- obtaining a measurement of the external angular velocity; and
- adjusting the measurement of the external angular velocity with the gain-correction factor.

17. The method according to claim 16, wherein:
generating the gain-correction factor includes dividing the current calibration scale factor by a previous calibration scale factor; and
adjusting the measurement of the external angular velocity includes dividing the measurement of the external angular velocity by the gain-correction factor.

18. The method according to claim 16, wherein:
applying the first quadrature force comprises generating a biasing voltage having a rest value in the first half-period; and
applying the second quadrature force comprises generating the biasing voltage having a quadrature-injection value, different from the rest value, in the second half-period.

19. The method according to claim 18, wherein generating the biasing voltage comprises generating first and second quadrature-injection signals each having first and second values, the first values of the first and second quadrature-injection signals being the same as each other, the second value of the first quadrature-injection signal being equal to the first value of the first and second quadrature-injection signals increased by a voltage step, and the second value of the second quadrature-injection signal being equal to the first value of the first and second quadrature-injection signals decreased by the voltage step.

20. The method according to claim 16, comprising:
demodulating the sensing signal with a first clock signal having a clock frequency to obtain a demodulated sensing signal;

calculating the measurement of the external angular velocity based on the demodulated sensing signal;

demodulating the sensing signal with a second clock signal having the clock frequency and phase-shifted by 90° with respect to the first clock signal to obtain a demodulated quadrature signal; and using the demodulated quadrature signal for determining the current calibration scale factor between the first and second values of the sensing signal.

* * * * *

UNITED STATES PATENT AND TRADEMARK OFFICE
CERTIFICATE OF CORRECTION

PATENT NO. : 11,340,069 B2
APPLICATION NO. : 16/898339
DATED : May 24, 2022
INVENTOR(S) : Luca Guerinoni et al.

Page 1 of 1

It is certified that error appears in the above-identified patent and that said Letters Patent is hereby corrected as shown below:

In the Claims

Column 18, Claim 10, Line 35:
"factor" should read: --factor,--.

Column 20, Claim 16, Lines 25 and 26:
"depend upon the movement" should read: --depend upon movement--.

Column 20, Claim 16, Line 26:
"movement of the first mobile" should read: --movement of the mobile--.

Signed and Sealed this
Twenty-sixth Day of July, 2022

Katherine Kelly Vidal
*Director of the United States Patent and Trademark Office*